United States Patent [19]

Tomiyasu et al.

[11] Patent Number: 4,731,316

[45] Date of Patent: Mar. 15, 1988

[54] PHOTOSENSITIVE COMPOSITION

[75] Inventors: Hiroshi Tomiyasu, Kawasaki; Yoshihiro Maeda, Yokohama; Kiyoshi Goto; Norihito Suzuki, both of Hachioji, all of Japan

[73] Assignees: Mitsubishi Chemical Industries Limited; Konishiroku Photo Industry Co., Ltd., both of Tokyo, Japan

[21] Appl. No.: 782,454

[22] Filed: Oct. 1, 1985

[30] Foreign Application Priority Data

Oct. 12, 1984 [JP] Japan ................. 59-212677

[51] Int. Cl.$^4$ ............ G03C 1/60; G03F 7/08
[52] U.S. Cl. ................. 430/157; 430/160; 430/171; 430/175; 430/176; 534/559; 534/561; 534/564; 534/565
[58] Field of Search ............. 430/175, 176, 171, 160, 430/157; 534/559, 561, 564, 565

[56] References Cited

U.S. PATENT DOCUMENTS

| | | | |
|---|---|---|---|
| 3,061,429 | 10/1962 | Neugebauer et al. | 430/176 |
| 3,064,562 | 11/1962 | Deal | 430/327 |
| 3,235,384 | 2/1966 | Neugebauer et al. | 430/175 |
| 3,679,419 | 7/1972 | Gillich | 430/175 |
| 4,123,276 | 10/1978 | Kita et al. | 430/175 |
| 4,186,017 | 1/1980 | Palmer | 430/175 |
| 4,232,105 | 11/1980 | Shinohara et al. | 430/175 |
| 4,288,520 | 9/1981 | Sprintschnik | 430/175 |
| 4,294,905 | 10/1981 | Okishi et al. | 430/175 |
| 4,526,854 | 7/1985 | Watanabe et al. | 430/175 |
| 4,576,893 | 3/1986 | Nakakita et al. | 430/175 |
| 4,614,701 | 9/1986 | Mori et al. | 430/175 |

FOREIGN PATENT DOCUMENTS

| | | |
|---|---|---|
| 54-30121 | 6/1979 | Japan . |
| 58-62641 | 4/1983 | Japan . |
| 59-78340 | 5/1984 | Japan . |

*Primary Examiner*—Charles L. Bowers, Jr.

*Attorney, Agent, or Firm*—Oblon, Fisher, Spivak, McClelland & Maier

[57] ABSTRACT

A photosensitive composition of this invention comprises:

(a) a photosensitive diazo resin represented by the following general formula (I):

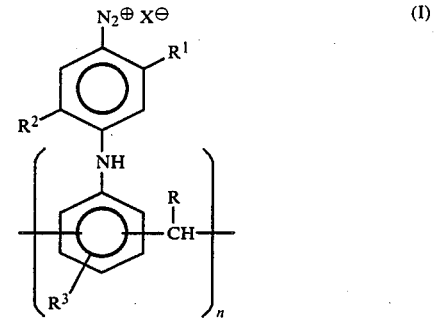

wherein $R^1$, $R^2$ and $R^3$ each represents a hydrogen atom, an alkyl or alkoxy group, R represents a hydrogen atom, an alkyl or phenyl group, X represents $PF_6$ or $BF_4$ and n represents a number of 1 to 200, in which a resin with the number n in the above formula being 5 or more is contained by more than 20 mol %, (b) an oleophilic high molecular weight compound with hydroxyl group and (c) a high molecular weight organic acid without hydroxyl group, and in which the content of the ingredient (c) is from 1.5 to 30% by weight based on the solid matter in said composition.

The photosensitive composition of this invention can provide a photosensitive layer having high sensitivity and being excellent in storage stability and developability as well as excellent in the film strength.

19 Claims, No Drawings

PHOTOSENSITIVE COMPOSITION

FIELD OF THE INVENTION

This invention relates to a novel photosensitive composition. More specifically, it relates to the photosensitive composition which can provide a photosensitive layer having high sensitivity and excellent storage stability, being free from contaminations in background areas, as well as providing a satisfactory film strength.

BACKGROUND OF THE INVENTION

Diazo resins prepared by reacting an aromatic diazonium salt, for example, diphenylamino-4-diazonium salt with an active carbonyl compound, for example, formaldehyde have widely been applied, particularly in the printing field as a photosensitive material for preparing an offset printing plate by taking advantage of the change of their solubility upon photolysis.

An offset printing plate is made by mixing the photosensitive material such as the diazo resin with a binder and the like followed by coating on a substrate of hydrophilic metal or paper, preferably aluminum. Upon imagewise exposure, the exposed areas in the printing plate is cured to become insoluble to a developer. Thus, by treating with the developer hydrophilic and oleophilic areas are formed on the plate, enabling to print with water and fatty ink.

Recently, it has been highly demanded in view of the workability or the like to increase the sensitivity of the printing plate. To this end, the development of the photosensitive material is proceeding.

It has been known that the photosensitive material comprising a mixture of the diazo compound with a high molecular weight compound is improved as compared with the photosensitive material comprising the diazo compound only because it has no requirement of subsequent lacquor application and exhibits an excellent performance of giving a stable printing plate. However, if the high molecular weight compound in the photosensitive composition is hydrophilic, the storage stability and the ink receptivity are poor to result in practical problems, although the developability and the compatability with the diazo resin are excellent. While on the other hand, if the high molecular weight compound is oleophilic, the developability, particularly with an aqueous developer is poor and unsatisfactory although the storage stability and the ink receptivity are excellent. Thus, the selection of the high molecular weight compound is a significant problem.

In view of the above, various kinds of high molecular weight compounds have been proposed. For example, in Japanese Patent Application Laid-Open No. 30604/1975, a polymer having the structural unit of the following general formula (II) was disclosed, but it is not still satisfactory due to its poor ink receptivity:

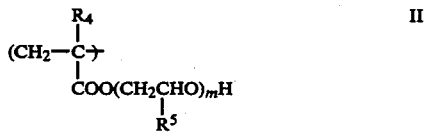

wherein $R^4$ represents a hydrogen atom or a methyl group, $R^5$ represents a hydrogen atom or a methyl, ethyl or chloromethyl group and m represents an integer from 1 to 10.

Further, in Japanese Patent Application Laid-Open No. 4144/1981 an acrylate polymer without a hydroxyl group-containing monomer was disclosed. This polymer is more excellent than the former polymer in the ink receptivity, but it is not satisfactory in the photosensitivity and the coatability. In Japanese Patent Application Laid-Open No. 98614/1979 is disclosed a high molecular compound comprising as an essential ingredient an aromatic hydroxyl group-containing monomer. Although this compound has a well balanced performance in view of the photosensitivity, the developability, the ink receptivity and the coatability, the stability under severe storage conditions, for example, at 80% humidity and 40° C. temperature, etc. is not acceptable.

While, the diazo resins have been also examined since they give a significant effect on the printing plate as in the high molecular weight compound. For example, Japanese Patent Publication No. 1167/1972 and U.S. Patent Specification No. 3300309 disclose organic salts such as organic sulfonates as an anion of diazo group, but they are inconvenient in use since the image upon exposure is visualizable with difficulty. In Japanese Patent Application Laid-Open No. 98613/1979 is disclosed inorganic salts such as halogenated Lewis acid salts as the anion of diazo group. They are unstable under severe storage conditions such as high temperature and high humidity, although the satisfactory visible images upon exposure can be obtained.

As described above, the high molecular weight compound as well as the diazo resin have been widely examined. However, it is difficult to obtain the satisfactory developability and storage stability even if they are combined. For solving the foregoing defects, the addition of an acid such as oxalic acid or tartaric acid (Japanese Patent Application Laid-Open Nos. 3216/1978 and 65430/1983), the addition of a high molecular weight organic acid (Japanese Patent Application Laid-Open No. 107238/1981) or the application of a subbing layer (Japanese Patent Application Laid-Open No. 21126/1981) has also been known, but any of them is unsuccessful.

An object of this invention is to provide a photosensitive composition excellent in the storage stability and the developability.

Another object of this invention is to provide a photosensitive composition having high sensitivity and being free from the contaminations in the background areas.

A further object of this invention is to provide a photosensitive layer having the film strength enough to withstand the overdevelopment and the print.

These and other objects of this invention will become apparent from the following description.

SUMMARY OF THE INVENTION

The foregoing objects can be attained in accordance with this invention by a photosensitve composition characterized in that a specific high molecular weight diazo resin as the $PF_6$ or $BF_4$ salt is used as the diazo resin and a high molecular weight organic acid in a specified amount is used therewith. That is, the photosensitive composition provided in accordance with this invention comprises:

(a) a photosensitive diazo resin represented by the following general formula:

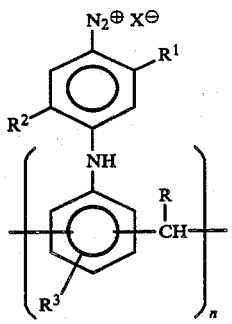

(I)

wherein $R^1$, $R^2$ and $R^3$ each represents a hydrogen atom, an alkyl or alkoxy group, R represents a hydrogen atom, an alkyl or phenyl group, X represents $PF_6$ or $BF_4$ and n represents a number from 1 to 200, in which a resin with the number n in the above formula being 5 or more is contained by more than 20 mol%, (b) an oleophilic high molecular weight compound with hydroxyl group, and (c) a high molecular weight organic acid without hydroxyl group and in which the content of the ingredient (c) is from 1.5 to 30% by weight based on the solid matter in the composition.

DETAILED DESCRIPTION OF THE INVENTION

The diazo resin used in this invention has the above-mentioned general formula (I) and contains a resin with the number n in the above-mentioned general formula being 5 or more by more than 20 mol%, preferably, from 20 to 60 mol %. If the content of the resin with the number n in the general formula being 5 or more is less than 20 mol%, the sensitivity of the printing plate is too poor to result in practical problems, as clear from the following examples.

The alkyl group and the alkoxy group for $R^1$, $R^2$ and $R^3$ as well as R in the formula are preferably, $C_{1-5}$ alkyl group and $C_{1-5}$ alkoxy group, respectively.

Such a diazo resin can be obtained by known methods, for example, the method as described in Photographic Science and Engineering, Vol. 17 (1973), p. 33 and U.S. Patent Specification Nos. 2063631 and 2679498. Alternatively, it may be obtained by polycondensation of a diazonium salt with an aldehyde, for example, paraformaldehyde, acetaldehyde or benzaldehyde in an inorganic acid such as sulfuric acid, phosphoric acid or hydrochloric acid. In the latter case, the diazonium salt and the aldehyde are usually reacted in the molar ratio of 1:0.6–1:2, preferably 1:0.7–1:1.5, at a low temperature (for example lower than 10° C.) for a short period (for example about three hours).

The thus obtained diazo resin may be advantageously mixed, with the oleophilic high molecular compound with hydroxyl group.

The oleophilic high molecular compound with hydroxyl group usable in this invention can include, for example, those copolymers having the molecular weight of from 20,000 to 200,000 and containing the following monomers:

(1) monomers containing aromatic hydroxyl group such as N-(4-hydroxyphenyl)acrylamide or methacrylamide, o-, m-, p-hydroxystyrene, o-, m-, p-hydroxyphenyl-acrylate or methacrylate;

(2) monomers containing aliphatic hydroxyl group such as 2-hydroxyethyl acrylate or methacrylate.

The polymer can be obtained by copolymerizing the above monomer containing hydroxyl group with at least one of other monomers copolymerizable therewith in accordance with the known methods.

Other monomers can include:

(1) α,β-unsaturated carboxylic acids such as acrylic acid, methacrylic acid and maleic anhydride;

(2) (substituted) alkyl acrylates such as methyl acrylate, ethyl acrylate, propyl acrylate, butyl acrylate, amyl acrylate, hexyl acrylate, octyl acrylate, 2-chloroethyl acrylate, 2-hydroxyethyl acrylate, glycidyl acrylate and N-dimethylaminoethyl acrylate;

(3) (substituted) alkyl methacrylates such as methyl methacrylate, ethyl methacrylate, propyl methacrylate, butyl methacrylate, amyl methacrylate, cyclohexyl methacrylate, 2-hydroxyethyl methacrylate, 4-hydroxybutyl methacrylate, glycidyl methacrylate and N-dimethylaminoethyl methacrylate;

(4) acrylamides or methacrylamides such as acrylamide, methacrylamide, N-methylol acrylamide, N-methylol methacrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide;

(5) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(6) vinyl esters such as vinyl acetate, vinyl chloroacetate, vinyl butylate and vinyl benzoate;

(7) styrenes such as styrene, α-methyl styrene, methyl styrene and chloromethyl styrene;

(8) vinyl ketones such as methyl vinyl ketone, ethyl vinyl ketone, propyl vinyl ketone and phenyl vinyl ketone;

(9) olefines such as ethylene, propylene, isobutylene, butadiene and isoprene;

(10) N-vinylpyrrolidone, N-vinylcarbazole, 4-vinylpyridine, acrylonitrile and methacrylonitrile.

These monomers are, however, not limitative but any other monomers may be used so long as they are copolymerizable with the monomers containing hydroxyl group. Furthermore, if necessary, polyvinyl butyral resin, polyurethane resin, polyamide resin, epoxy resin, novolac resin, natural resin and the like may also be added.

The high molecular organic acid without hydroxyl group usable in this invention can include, for example, homopolymer or copolymer of acrylic acid, homopolymer or copolymer of methacrylic acid, carboxylic acid-modified novolac resin or the like. Among them, polyacrylic acid is particularly preferred. The molecular weight of these high molecular organic acids is from 1,000 to 100,000, preferably from 2,000 to 30,000.

As mentioned above, the photosensitive composition according to this invention comprises necessarily three ingredients, i.e. specific diazo resin, oleophilic high molecular compound with hydroxyl group and high molecular weight organic acid without hydroxyl group. Three ingredients are incorporated in the composition in the following proportion based on the solid matter of the composition. The diazo resin is incorporated by generally from 1 to 60% by weight, preferably from 3 to 30% by weight. The oleophilic high molecular weight compound with hydroxyl group is incorporated by generally from 40 to 99% by weight, preferably from 50 to 95% by weight. And the high molecular weight organic acid without hydroxyl group is incorporated by from 1.5 to 30% by weight, preferably from 1.5 to 15% by weight. Among them, the content of the high molecular weight organic acid without hydroxyl group is especially important since the composition tends to be unstable during storage if its content is less than 1.5% by weight.

To further improve the performance, various known additives shown below can further be added to the photosensitive composition according to this invention.
(1) dye for visualizing images;
(2) fluorine type surface active agent or alkyl ethers for improving the coatability;
(3) plasticizer for providing a coated film with the flexibility and abrasion resistance;
(4) oleophilic compound;
(5) stabilizer.

The content for these additives is generally from 0.01 to 30% by weight based on the solid matter of the composition.

The photosensitive composition according to this invention is previously dissolved in an appropriate solvent, for example, methyl cellosolve, methyl ethyl ketone, ethyl cellosolve, cyclohexanone, dioxane, ethyl acetate, benzyl alcohol and diacetone alcohol. Then, the composition in solution is coated on a substrate by commonly employed coating techniques to obtain a photosensitive printing plate. The coating amount is usually from about 0.5 to about 5 g/m² on the dry basis.

While any of known substrates can be used, aluminum sheet or other metal sheets, metal laminate films or the like are preferred, the aluminum plates being particularly preferred. It is preferable to use the substrate treated with the known treating techniques. Graining, anodic oxidization and hydrophilic treatment are commonly available. As the graining brush polishing, electrolytic etching or the like may be used, but electrolytic etching is preferred since grains can be uniformly obtained. The anodic oxidation is carried out by using the electrolytic solution such as sulfuric acid, phosphoric acid or a mixture thereof. The amount of the anodic oxide film is preferably from 2 to 50 mg/dm², more preferably from 5 to 30 mg/dm². If the amount is less than 2 mg/dm², abrasion resistance of the non-image areas in the printing plate is not enough to withstand the stresses during printing. On the other hand, if it exceeds 50 mg/dm², the image reproducibility is poor. While the hydrophilic treatment can include, for example, hot water sealing or sodium silicate treatment, the sodium silicate treatment is preferred in view of the developability. The sodium silicate treatment is usually carried out by immersing the substrate in a sodium methasilicate solution of a concentration from 0.1 to 5% at a temperature from 50° C. to 95° C. for a time from 10 sec to 5 min. Preferably, subsequent treatment of immersing in water at a temperature of 60° C. to 100° C. for a time from 10 sec to 5 min. may be carried out.

After the thus prepared photosensitive litho printing plate is subjected to the exposure through an overlying original to be copied or the electronic scanning in accordance with the conventional manners, corresponding images can be formed on the substrate by developing with a developer. A light source suitable to the exposure can include metal halide lamp, mercury lamp, carbon arc lamp and the like.

Though the developers used for the development of the photosensitive printing plate according to this invention are not particularly limited, water, aqueous solutions containing specific organic solvnets and/or alkaline agents are preferred. The specific organic solvent used herein means those organic solvents capable of dissolving or swelling the non-exposed area (non-image area) in the photosensitive composition layer when incorporated in the developer and having water solubility at 20° C. of less than 10% by weight. Such an organic solvents may include, for example, esters of carboxylic acid such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexanone; ethers scuh as ethylene glycol monobutyl ether, ethylene glycol benzyl ether and ethylene glycol monophenyl ether; alcohols such as benzyl alcohol, methylphenyl carbinol, n-amyl alcohol and methylamyl alcohol; alkyl-substituted aromatic hydrocarbons such as xylene; and halogenated hydrocarbons such as methylene dichloride, ethylene dichloride and monochlorobenzene, and a mixture thereof. Among the above organic solvents, ethylene glycol monophenyl ether and benzyl alcohol are particularly preferable. The content of the organic solvent in the developer is generally from 1 to 20% by weight, particularly preferable content being from 2 to 10% by weight.

The alkaline agent contained in the developer includes:
(A) inorganic alkaline agent such as sodium silicate, potassium silicate, potassium hydroxide, sodium hydroxide, lithium hydroxide, sodium or ammonium bi- or tri-phosphate, sodium metasilicate, sodium carbonate and ammonia, etc. and
(B) organic amine compound such as mono-, di- or trimethylamine, mono-, di- or triethylamine, mono- or diisopropylamine, n-butylamine, mono-, di- or triethanolamine, mono-, di- or triisopropanolamine, ethyleneimine and ethylenediamine, etc. The content of the alkaline agent in the developer is usually from 0.05 to 4% by weight, the preferable content being from 0.5 to 2% by weight.

In order to further improve the storage stability, the ability of printing more copies or the like of the printing plate, it is preferred to incorporate a water soluble sulfite in the developer. As the water soluble sulfite an alkali or alkaline earth metal sulfite is preferred, which includes, for example, sodium sulfite, potassium sulfite, lithium sulfite and magnesium sulfite. The content of the sulfite in the developer composition is usually from 0.05 to 4% by weight, preferably from 0.1 to 1% by weight.

In order to promote the dissolution of the above organic solvent to water, certain solubilizing agent may also be incorporated. Alcohols or ketones, preferably those of higher water solubility and lower molecular weight than those of the organic solvent used herein and further anionic active agents, amphoteric active agents, etc. are preferably used. These alcohols and ketones preferably used herein include, for example, methanol, ethanol, propanol, butanol, acetone, methyl ethyl ketone, ethylene glycol monomethyl ether, ethylene glycol monoethyl ether, methoxy butanol, ethoxy butanol, 4-methoxy-4-methyl butanol and N-methyl pyrrolidone. Preferred active agents can include, for example, sodium isopropylnaphthalene sulfonate, sodium n-butylnaphthalene sulfonate, sodium N-methyl- N-pentadecylamino acetate and sodium lauryl sulfate. There are no particular restrictions for the used amount of the solubilizing agent, but it is preferably used generally by less than about 30% by weight based on the developer.

The photosensitive printing plate after imagewise exposure may be contacted or rubbed lightly with the developer as described above, whereby after 10 to 60 sec. at a temperature from room temperature to about 40° C., the photosensitive composition in the not-exposed areas being completely removed with no undesired effects on the exposed areas of the photosensitive composition layer.

In the photosensitive printing plate having the layer of the photosensitive composition according to this invention, the development performance is high and the developability is not substantially changed after storing under severe conditions and/or after producing many copies. Furthermore, neither discoloration nor degradation in color of the finish is resulted. In addition, there is no problems in view of environmental pollutions and public health.

Preparation examples for the diazo compound, the polymer, as well as the substrate for use in this invention will be explained.

(Polymer-1)

After dissolving 10.0 g of N-(4-hydroxyphenyl)methacrylamide, 25 g of acrylonitrile, 60 g of ethyl acrylate, 5 g of methacrylic acid and 1.642 g of azobisisobutyronitrile in 112 ml of 1:1 mixed solvent of acetone/methanol and replacing with nitrogen, they were heated at 60° C. for 8 hours.

After the reaction was over, the reaction solution was poured into 5 l of water under stirring and the resulted white precipitates were collected through filtration and dried to obtain 90 g of polymer-1.

This polymer was subjected to gel permeation chromatography (GPC) to determine the molecular weight. Its weight average molecular weight was 85,000.

(Polymer-2)

A mixture of 50.0 g of 2-hydroxyethyl methacrylate, 20 g of acrylonitrile, 25 g of methyl methacryl, 5 g of methacrylic acid and 1.2 g of benzoyl peroxide was added dropwise for 2 hours into 300 g of ethylene glycol monomethyl ether heated to 100° C. After the addition was completed, 300 g of ethylene glycol monomethyl ether and 0.3 g of benzoyl peroxide were added and they were reacted directly for 4 hours. After the reaction was over, the reaction solution was diluted with methanol and poured into 5 l of water under stirring. The resulted white precipitates were collected through filtration and dried to obtain 93 g of polymer-2.

This polymer was subjected to GPC to determine the molecular weight. Its weight average molecular weight was 65,000.

(Polymer-3)

A mixture of 45 g of 2-hydroxyethyl methacrylate, 10 g of acrylonitrile, 35 g of ethyl methacrylate, 10 g of methacrylic acid and 1.2 g of benzoyl peroxide was added dropwise into ethylene glycol monomethyl ether in the same manner as in the synthesis of the polymer-2, to obtain 90 g of polymer-3.

The polymer was subjected to GPC to determine the molecular weight. Its weight average molecular weight was 62,000.

(Diazo Resin-1)

Under ice cooling, 14.5 g (50 mmol) of p-diazodiphenylamine sulfate were dissolved in 40.9 g of concentrated sulfuric acid. 1.5 g (50 mmol) of paraformaldehyde were added dropwise slowly to the reaction solution. The addition was carried out while maintaining the reaction temperature of not more than 10° C. Then, the stirring was continued for 2 hours under ice cooling.

The reaction mixture was added dropwise into 500 ml of ethanol under ice cooling and the resulted precipitates were filtered. After washing with ethanol, the precipitates were dissolved in 100 ml of purified water, to which an aqueous cold concentrated solution containing 6.8 g of zinc chloride dissolved therein was added. The resulted precipitates were filtered, followed by washing with ethanol and then dissolved in 150 ml of purified water. To the solution an aqueous cold concentrated solution containing 8 g of ammonium hexafluorophosphate dissolved therein was added. The resulted precipitates were collected through filtration, washed with water and then dried over one day and one night at 30° C. to obtain diazo resin-1.

This diazo resin-1 was subjected to GPC to determine the molecular weight. It contained about 50 mol % of hexamer and higher oligomers.

(Diazo Resin-2)

The synthetic procedures in the synthesis of diazo resin-1 were repeated, excepting that the aqueous ammonium hexafluorophosphate solution in the final treatment was replaced with aqueous solution containing 15 g of 2-hydroxy-4-methoxybenzophenone-5-sulfonic acid dissolved therein, to obtain diazo resin-2.

This diazo resin-2 was subjected to GPC to determine the molecular weight. It contained about 55 mol% of hexamer and higher oligomers.

(Diazo Resin-3)

The synthetic procedures in the synthesis of diazo resin-1 were repeated excepting that 4-diazodiphenylamine sulfate and paraformaldehyde was changed so as to condense in a ratio of 1:0.6, to obtain diazo resin-3.

This diazo resin-3 was subjected to GPC to determine the molecular weight. It contained about 12 mol% of pentamer or higher oligomers.

(Aluminum Plate)

An aluminum plate was degreased by immersing in an aqueous 3% solution of sodium hydroxide, washed with water, subjected to the electrolytical etching in an aqueous mixed solution of 1% hydrochloric acid and 1% boric acid at 25° C., with a current density of 3 A/dm$^2$ for 5 minutes, washed with water, immersed in an aqueous 0.9% solution of sodium hydroxide, washed with water, subjected to anode oxidization at 30° C., with a current density of 1.5 A/dm$^2$ for 2 min in 40 w/w % sulfuric acid solution, washed with water, immersed in water of pH 8.5 and 90° C. for 25 sec., washed with water and finally dried to make an aluminum plate.

EXAMPLE

This invention will now be described more specifically referring to non-limitative examples.

EXAMPLES 1-3 AND COMPARATIVE EXAMPLES 1-5

The aluminum plates made as above were coated with sensitizing solution-1 or sensitizing solution-2 having the following composition in an amount of 1.5 g/m² on the dry basis by using whirler. Then, they were dried at a temperature of 85° C. for 3 min., to obtain photosensitive litho printing plates.

| (Sensitizing Solution-1) | |
|---|---|
| Polymer-1 | 10 g |
| Diazo resin-1 | 1 g |
| Victoria Pure Blue-BOH (manufactured by HODOGAYA CHEMICAL CO., LTD.) | 0.2 g |
| Methyl cellosolve | 180 ml |
| Polyacrylic acid | 0–0.9 g |
| Sensitizing Solution-2 | |
| Polymer-1 | 10 g |
| Diazo resin-3 | 1 g |
| Victoria Pure Blue-BOH | 0.2 g |
| Methyl cellosolve | 180 ml |
| Polyacrylic acid | 0–0.3 g |

Each of the thus obtained photosensitive litho printing plates were exposed for 30 sec. by using a 3 KW extra-high pressure mercury lamp at a distance of 60 cm, developed with the following developer to obtain a litho printing plates. The developability (development property) of the plate after preserving for a predetermined period was measured. The results are shown in Table 1.

| (Developer) | |
|---|---|
| Benzyl alcohol | 50 g |
| Triethanol amine | 15 g |
| Sodium sulfite | 5 g |
| Sodium butylnaphthalene sulfonate | 25 g |
| Water | 1,000 g |

TABLE 1

| | Comparative Example 1 | Comparative Example 2 | Example 1 | Example 2 | Example 3 | Comparative Example 3 | Comparative Example 4 | Comparative Example 5 |
|---|---|---|---|---|---|---|---|---|
| Sensitizing solution | 1 | 1 | 1 | 1 | 1 | 2 | 2 | 2 |
| Polyacrylic acid (g) | 0 | 0.1 | 0.3 | 0.6 | 0.9 | 0 | 0.1 | 0.3 |
| Sensitivity (number of step wedge stages) | 6.1 | 6.2 | 6.0 | 5.8 | 5.9 | 4.5 | 4.3 | 4.1 |
| Storage stability (developability)* | | | | | | | | |
| D.T. 55° C. | | | | | | | | |
| 0 day | 3 | 5 | 10 | 10 | 10 | 5 | 10 | 10 |
| 3 days | 1 | 3 | 10 | 10 | 10 | 3 | 5 | 10 |
| 6 days | 1 | 3 | 8 | 10 | 10 | 1 | 3 | 10 |
| H.T. 40° C. - 80% | | | | | | | | |
| 0 day | 3 | 5 | 10 | 10 | 10 | 5 | 10 | 10 |
| 5 days | 2 | 4 | 9 | 10 | 10 | 4 | 6 | 10 |
| 10 days | 2 | 3 | 9 | 10 | 10 | 2 | 3 | 10 |

*Evaluation standard for developability
10: extremely satisfactory

5: ordinary

1: extremely poor

From the results shown in Table 1, it can be seen that the use of the photosensitive composition according to this invention can provide the photosensitive layer which is highly sensitive and extremely excellent in the storage stability.

The litho printing plate obtained in Example 1 was mounted on a sheet-fed offset press to print on wood free papers, 180,000 copies could be produced. The copies thus produced were clean with no contaminations in the background areas.

EXAMPLES 4-6 AND COMPARATIVE EXAMPLES 6-8

In the same procedures as in Example 1, the aluminum plates were coated with the sensitizing solution-3 having the following composition in an amount of 1.5 g/m² on dry basis. Then, they were exposed, developed and measured for the sensitivity and the storage stability. The results are shown in Table 2.

| (Sensitizing Solution-3) | |
|---|---|
| Polymer-1, -2 or -3 | 10 g |
| Diazo resin-1 | 1 g |
| Victoria Pure Blue-BOH | 0.2 g |
| Methyl cellosolve | 170 ml |
| Polyacrylic acid | 0.6 g or 0.1 g |

TABLE 2

| | Example 4 | Example 5 | Example 6 | Comparative Example 6 | Comparative Example 7 | Comparative Example 8 |
|---|---|---|---|---|---|---|
| Polyacrylic acid (g) | | 0.6 | | | 0.1 | |
| Polymer | 1 | 2 | 3 | 1 | 2 | 3 |
| Sensitivity (number of step wedge stages) | 5.8 | 6.2 | 5.5 | 6.2 | 7.0 | 6.4 |
| Storage stability | | | | | | |

TABLE 2-continued

|  | Example 4 | Example 5 | Example 6 | Comparative Example 6 | Comparative Example 7 | Comparative Example 8 |
|---|---|---|---|---|---|---|
| (developability) D.T. 55° C. |  |  |  |  |  |  |
| 0 day | 10 | 10 | 10 | 5 | 3 | 5 |
| 3 days | 10 | 9 | 10 | 3 | 2 | 3 |
| 6 days | 10 | 5 | 8 | 3 | 1 | 3 |

From the results shown in Table 2, it can be seen that the use the photosensitive composition according to this invention can provide the photosensitive layer which is highly sensitive and extremely excellent in the storage stability.

The litho printing plate obtained in Example 6 was mounted on a sheet-fed offset press to print wood free papers. 200,000 copies could be produced. The thus produced copies were clean with no contaminations in the background areas.

EXAMPLES 7–8 AND COMPARATIVE EXAMPLES 9–10

In the same procedures as in Example 1, the aluminum plates were coated with the sensitizing solution-4 having the following composition in an amount of 1.5 g/m² on dry basis. The results are shown in Table 3.

| (Sensitizing Solution-4) | |
|---|---|
| Polymer-1 or -2 | 10 g |
| Diazo resin-1 or -2 | 1 g |
| Victoria Pure Blue-BOH | 0.2 g |
| Methyl cellosolve | 170 ml |
| Dimethylformamide | 10 ml |
| Polyacrylic acid | 0.6 g |

TABLE 3

|  | Example 7 | Comparative Example 9 | Example 8 | Comparative Example 10 |
|---|---|---|---|---|
| Polymer | 3 | 3 | 1 | 1 |
| Diazo resin | 1 | 2 | 1 | 2 |
| Sensitivity (number of step wedge stages) | 5.5 | 5.3 | 5.6 | 5.4 |
| Storage stability (developability) D.T. (55° C.) |  |  |  |  |
| 0 day | 10 | 10 | 10 | 10 |
| 3 days | 10 | 10 | 10 | 10 |
| 6 days | 8 | 10 | 10 | 10 |
| Change in the stage number in overdevelopment |  |  |  |  |
| 10 reciprocations with light rubbing | not changed | changed by three stages | not changed | changed by two stages |
| 30 reciprocations with light rubbing | not changed | image extinguished | not changed | changed by five stages |

From the results shown in Table 3, it can be seen that the use of the photosensitive composition according to this invention can provide the photosensitive layer which is also excellent in the film strength.

COMPARATIVE EXAMPLE 11

On this example, oxalic acid of a low molecular organic acid was used in place of the high molecular organic acid (for example, polyacrylic acid).

In the same procedures as in Example 1, the aluminum plates were coated with the sensitizing solution-5 having the following composition, exposed and developed to obtain printing plates.

| (Sensitizing Solution-5) | |
|---|---|
| Polymer-1 or -2 | 10 g |
| Diazo resin-1 | 1 g |
| Victoria Pure Blue-BOH | 0.2 g |
| Methyl cellosolve | 180 ml |
| Oxalic acid | 0.3 g |

The printing plates after storing for three days at D.T. (55° C.) were used for printing on a sheet-fed press. Both of the plates resulted in stains to reveal that they involve problems in view of the storage stability.

As described above specifically, the use of the photosensitive composition according to this invention can provide a significant effect. That is, a photosensitive layer which is highly sensitive and, excellent in storage stability, free from contaminations in background areas as well as, excellent in film strength can be obtained.

What is claimed is:

1. A photosensitive composition, comprising an admixture of:

(a) a photosensitively effective amount of a photosensitive diazo resin of formula (I):

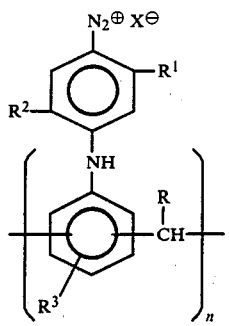

wherein $R^1$, $R^2$ and $R^3$ each represents hydrogen, alkyl or alkoxy, R represents hydrogen, alkyl or phenyl, X represents $PF_6$ or $BF_4$ and n represents a number from 1 to 200, and wherein the fraction of resin which has a molecular weight defined by the number n in the above formula as 5 or more is than 20 mol% of the total diazo resin present;

(b) a bindingly effective amount of an oleophilic high molecular weight compound which contains aromatic or aliphatic hydroxyl groups in a side chain thereof prepared from a monomer composition containing acrylic acid, methacrylic acid and derivatives thereof as monomeric units;

(c) a water soluble high molecular weight, non-hydroxyl group containing organic acid which contains carboxylic acid groups, said ingredient (c) being present in an amount of from 1.5 to 30% by weight based on solid matter in said composition.

2. The composition of claim 1, wherein the fraction of said resin which has a molecular weight defined by the number n in the formula above as 5 or more, is 20 to 60 mol% of the total diazo resin present.

3. The composition of claim 1 or 2, wherein the oleophilic compound is a copolymer containing a monomer with an aromatic or aliphatic hydroxyl group, which has a molecular weight of 20,000 to 200,00.

4. The composition of claim 3, wherein the monomer with the aromatic hydroxyl group is N-(4-hydroxyphenyl)acrylamide, N-(4-hydroxyphenyl) methacrylamide, o-, m-, p-hydroxystyrene, o-, m-, p-hydroxyphenyl acrylate or o-, m-, p-hydroxyphenyl methacrylate.

5. The composition of claim 3, wherein the monomer with the aliphatic hydroxyl group is 2-hydroxyethyl acrylate or 2-hydroxyethyl methacrylate.

6. The composition of claim 3, wherein the oleophilic compound comprises the monomer with the aromatic or aliphatic hydroxyl group and at least one other monomer selected from the group consisting of unsaturated carboxylic acids, alkylacrylates, alkylmethacrylates, acrylamides, methacrylamides, vinylethers, vinylesters, styrenes, vinylketones, olefines, N-vinylpyrrolidone, N-vinylcarbazole, N-vinylpyridine, acrylonitrile and methacrylonitrile.

7. The composition of claim 1, wherein said organic acid (c) is polyacrylic acid.

8. The composition of claim 1, wherein the molecular weight of said organic acid (c) is 1,000 to 100,000.

9. The composition of claim 8, wherein the molecular weight of said organic acid (c) is 2,000 to 30,000.

10. The composition of claim 1, wherein the content of said photosensitive diazo resin (a) is 1 to 60% by weight based on solid matter in the composition.

11. The composition of claim 10, wherein the content of the photosensitive diazo resin (c) is 3 to 30% by weight based on solid matter in the composition.

12. The composition of claim 1, wherein the content of the oleophilic compound (b) is 40 to 99% by weight based on solid matter in the composition.

13. The composition of claim 12, wherein the content of the oleophilic compound (b) is 50 to 95% by weight based on solid matter in the composition.

14. The composition of claim 1, wherein the content of the organic acid (c) is 1.5 to 15% by weight based on solid matter in the composition.

15. The composition of claim 1, wherein said organic acid (c) component is a homopolymer or a copolymer of acrylic acid, a homopolymer or copolymer of methacrylic acid, or a carboxylic acid-modified novolac resin.

16. The composition of claim 1, wherein said composition further comprises at least one additive selected from the group consisting of a dye, a fluorine containing surface active agent or alkyl ether, a plasticizer, an oleophilic compound, and a stabilizer.

17. The composition of claim 16, wherein said additives are present in said composition in an amount ranging from 0.01 to 30% by weight based on solid matter in the composition.

18. A printing plate, comprising:
a layer of the composition of claim 1 on a substrate.

19. The printing plate of claim 18, wherein said substrate is an aluminum plate.

* * * * *